(12) United States Patent
Wakrat et al.

(10) Patent No.: US 8,319,326 B2
(45) Date of Patent: Nov. 27, 2012

(54) STACKED DIE WITH VERTICALLY-ALIGNED CONDUCTORS AND METHODS FOR MAKING THE SAME

(75) Inventors: Nir J. Wakrat, Los Altos, CA (US); Nick Seroff, Los Gatos, CA (US); Anthony Fai, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 212 days.

(21) Appl. No.: 12/895,098

(22) Filed: Sep. 30, 2010

(65) Prior Publication Data

US 2012/0084478 A1 Apr. 5, 2012

(51) Int. Cl.
*H01L 23/02* (2006.01)

(52) U.S. Cl. . 257/686; 257/685; 257/777; 257/E25.006; 257/E25.021; 257/E25.027; 257/E23.085; 438/109

(58) Field of Classification Search .................. 257/685, 257/686, 723, 777, E25.005, E25.006, E25.013, 257/E25.021, E25.027, E23.095; 438/109, 438/FOR. 368, FOR. 426
See application file for complete search history.

(56) References Cited

U.S. PATENT DOCUMENTS

| | | | | |
|---|---|---|---|---|
| 5,936,302 A | * | 8/1999 | Pedersen et al. | 257/665 |
| 6,967,411 B2 | * | 11/2005 | Eide | 257/781 |
| 7,820,484 B2 | * | 10/2010 | Chua et al. | 438/109 |
| 7,989,265 B2 | * | 8/2011 | Ware et al. | 438/109 |
| 2001/0017406 A1 | * | 8/2001 | Hong | 257/686 |
| 2007/0102800 A1 | * | 5/2007 | Kang | 257/686 |
| 2007/0223159 A1 | * | 9/2007 | Haba | 361/58 |

* cited by examiner

*Primary Examiner* — Jasmine Clark
(74) *Attorney, Agent, or Firm* — Kramer Levin Naftalis & Frankel LLP (57) ABSTRACT

Stacked die having vertically-aligned conductors and methods for making the same are disclosed for providing a non-volatile memory, such as flash memory (e.g., NAND flash memory), for use in an electronic device.

15 Claims, 10 Drawing Sheets

STACKED DIE WITH VERTICALLY-ALIGNED CONDUCTORS AND METHODS FOR MAKING THE SAME

FIELD OF THE INVENTION

This invention can relate to packaging of silicon die, and in particular, to vertical stacking of non-volatile memory, such as flash memory.

BACKGROUND

NAND flash memory, as well as other types of non-volatile memories ("NVMs"), is commonly used for mass storage. For example, consumer electronics such as portable media players or cellular telephones often include raw flash memory or a flash card to store music, videos, and other media.

The flash memory exists in the form of a silicon die, and in some implementations, more than one die may be used. Multiple die implementations provide greater mass storage capacity, but requires additional real estate and associated supporting electronics such as busses, control circuitry, power circuitry (e.g., charge pumps). The trend for decreasing size and increased capabilities of electronic devices has placed a premium on space. Thus, as the demand for increased mass storage space continues to grow, effective silicon packaging arrangements are needed.

SUMMARY

Stacked die having vertically-aligned conductors and methods for making the same are disclosed for providing a non-volatile memory, such as flash memory (e.g., NAND flash memory), for use in an electronic device. The stacked die form part of a stacked NVM die package that includes control circuitry and vertically aligned conductors that electrically couple the die to the control circuitry.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION

NVM packages having control circuitry and two or more NVM die stacked in a vertical arrangement and methods for the production thereof are provided. Each die has interface bus connectors that extend beyond the edge of the die in a plane parallel to either a top or bottom surface of the die. The interface bus connectors are electrically coupled to vertical conductors that are aligned perpendicular to the plane of the top or bottom surface of the die, and each vertical conductor is electrically coupled to the control circuitry.

The position of interface bus connectors in the stack can be provided in many different configurations. In some embodiments, the interface conductors can be arranged such that the interface bus connectors of one die do not overlap the interface bus connectors of any other die in the stack. This permits direct electrical coupling between the control circuitry and any interface bus connector by dedicating placement of a vertical conductor to only that interface bus connector.

Figure 1A:
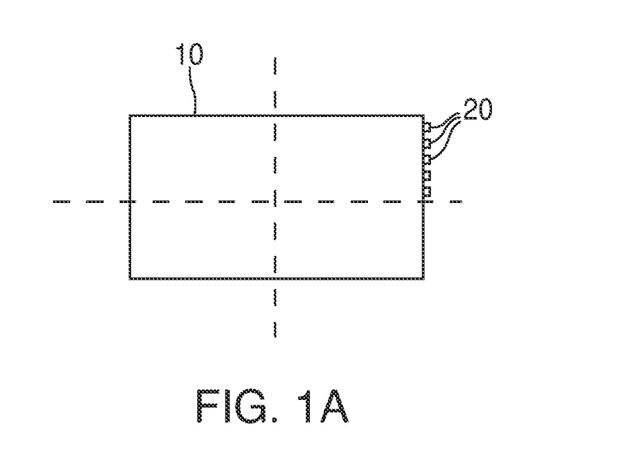
FIGS. 1A and 1B show illustrative views of a die in accordance with an embodiment of the invention.
Figure 1B:
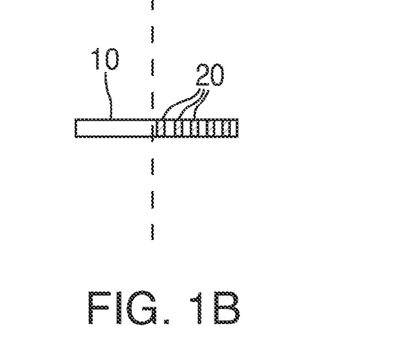

FIGS. 1A and 1B show illustrative views of die 10 having interface bus connectors 20 positioned in a quadrant in accordance with an embodiment of the invention. FIG. 1A shows a top view of die 10, and illustrates with dashed lines how die 10 can be divided into four quadrants. FIG. 1B shows a side view of die 10, and illustrates two visible quadrants. Die 10 can be rectangular in shape and has a length, width, top surface, bottom surface, and edges. Interface bus connectors 20 extend away from the edge of die 10 in a predetermined quadrant, shown in FIG. 1A to be the upper right quadrant.

Die 10 can include a NAND flash memory based on floating gate or charge trapping technology, NOR flash memory, EPROM, EEPROM, Ferroelectric RAM ("FRAM"), or magnetoresistive RAM ("MRAM"). Die 10 may be "raw" NAND and as such includes single-level cells ("SLC") and/or multi-level cells ("MLC") for storing data, address lines (e.g., word lines), addressing circuitry for accessing the SLC or MLC cells, and other die specific circuitry such as charge pumps. Any circuitry located on die 10 is referred to herein as die circuitry. Interface bus connectors 20 may be electrically coupled to pads (not shown) that enable data to be transferred to and from die 10. The pads may be located near the edge of die 10 in the predetermined quadrant. Thus, although the pads are located near the edge, traces may be routed throughout to interconnect the pads to die circuitry.

Figure 2:
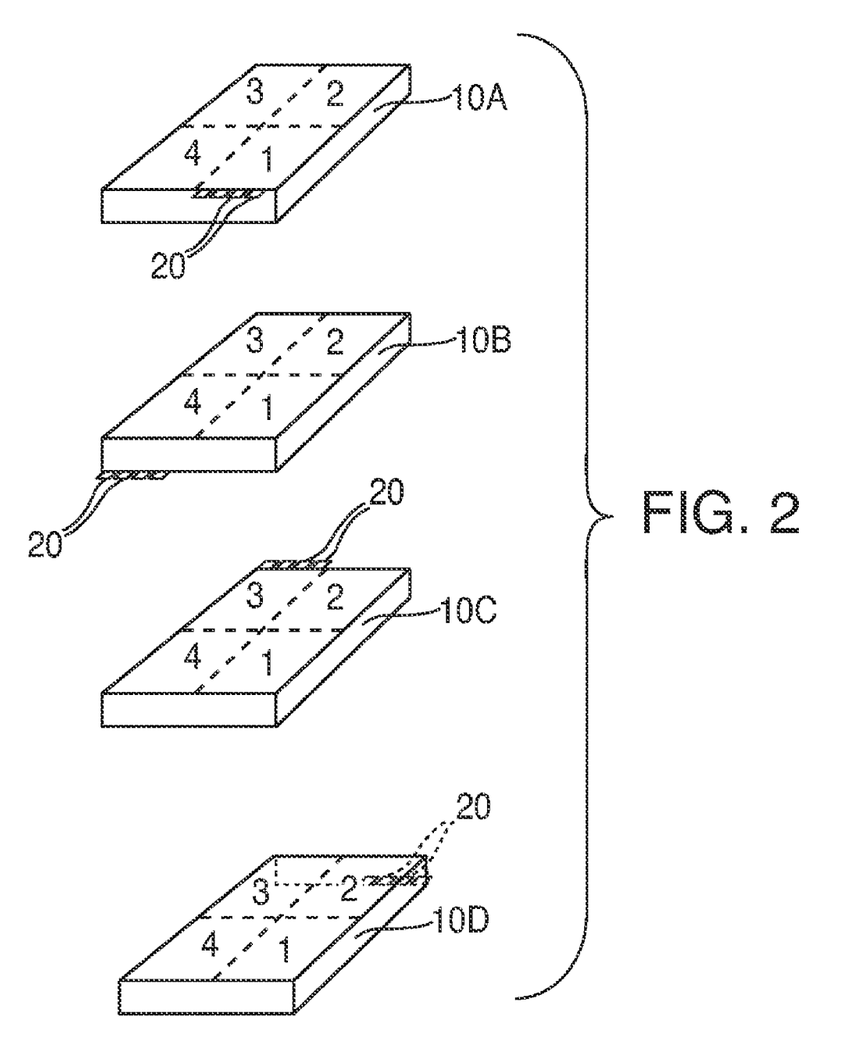
FIG. 2 shows an illustrative exploded view of how four copies of a die can be oriented to provide a stacked NVM package in accordance to an embodiment of the invention.

In some embodiments, a NVM package can be assembled by stacking two or more die 10 on top of each other. Because each die 10 is identical, each die 10 used in the stack is positioned in a different orientation so that interface bus connectors 20 do not overlap each other. FIG. 2 shows an illustrative exploded view of how four copies of die 10 can be oriented to provide a stacked NVM package according to an embodiment of the invention. Dies 10A, 10B, 10C, and 10D each have the same construction as die 10 of FIG. 1A and thus each have interface bus connectors 20 in the same predetermined quadrant.

Each die is oriented such that its interface bus connectors are positioned in a different zone. A zone is a virtual region extending throughout the height of the NVM die stack and is independent of any quadrant housing interface bus connectors 20. Four zones, labeled 1-4, are shown on each die 10A-D. As shown, each zone remains the same throughout the height of the NVM die stack. Die 10A has its interface bus connectors 20 located in zone 1; Die 10B has its interface bus connectors 20 located in zone 4; Die 10C has its interface bus connectors 20 located in zone 3; and Die 10D has its interface bus connectors 20 located in zone 2. It is understood that although zones 1-4 coincide with the quadrants, this is merely illustrative and that any region of suitable size and shape can be designated as a zone.

The orientation of dies 10A-D can be achieved by rotating and/or flipping three of the dies with respect to one die—a reference die. For example, assume die 10A is a reference die, which has its interface bus connectors in zone 1. Die 10B is flipped over so that its interface bus connectors are positioned in zone 4. Die 10C is rotated 180 degrees so that its interface conductors 20 are positioned in zone 3. Die 10D is rotated 180 degrees and flipped over to position its interface bus connectors 20 in zone 2.

Figure 3:
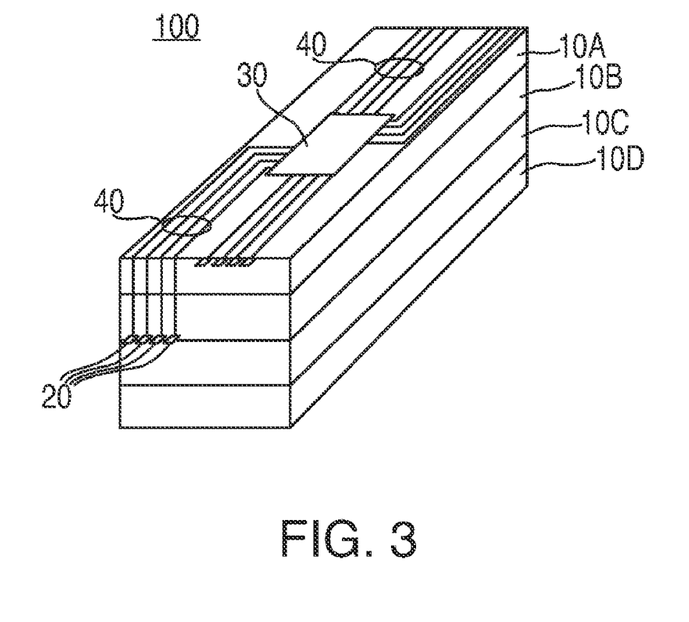
FIG. 3 shows an illustrative perspective view of stacked NVM package in accordance with an embodiment of the invention.

Referring now to FIG. 3, an illustrative perspective view of stacked NVM package 100 is shown. Stacked NVM package 100 can include dies 10A-D, control circuitry 30, and conductors 40. Dies 10A-D can have the same orientation as that shown in FIG. 2, resulting in interface bus connectors 20 being positioned in different zones.

Control circuitry 30 can be mounted on the top surface of die 10A. Alternatively, control circuitry 30 can be mounted on the bottom surface of die 10D. As a further alternative, control circuitry 30 can be mounted between any two die. For example, control circuitry 30 can be mounted between die 10B and die 10C. Any of these mounts assist in minimizing area requirements on a printed circuit board because control circuitry 30 is mounted in line with the die stack and not adjacent to or peripheral to the die stack.

Control circuitry 30 is operative to perform any number of NVM operations and can include an interface for communicating with dies 10A-D and circuitry located remote to package 100. The NVM operations can include operations for providing a complete managed Nand solution such as maintaining translation tables, wear leveling, refresh events, garbage collection, and error correction.

The NVM operations can include operations for performing a simplified managed Nand solution such as error correction. Additional details of various control circuitry 30 functions are discussed below in connection with FIG. 12.

Conductors 40 electrically couple interface bus connectors 20 of dies 10A-D to control circuitry 30. Conductors 40 do not overlap each other, nor do they crisscross each other. Some of conductors 40 include a vertical portion that is mounted to one or more edges of dies 10A-D and that interfaces with interface bus connectors 20. Conductors 40 may also include a horizontal portion that is mounted on a surface of a die. As shown in FIG. 3, conductors 40 designated for die 10A may only include a horizontal portion, whereas conductors 40 designated for die 10B can include both horizontal and vertical portions.

Conductors 40 can be constructed from any material suitable for transmitting electrical signals. For example, conductors 40 can be constructed from an electrical epoxy or metal traces. Conductors 40 may be electrically isolated from each other. For example, conductors 40 may be coated with a dielectric material.

Figure 4:
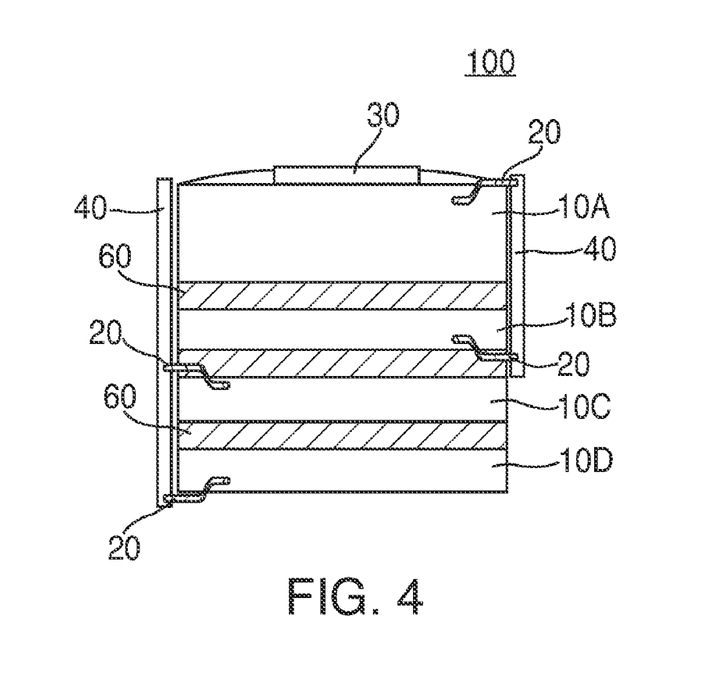
FIG. 4 shows an illustrative cross-sectional view of the NVM package of FIG. 3 in accordance with an embodiment of the invention.

FIG. 4 shows an illustrative cross-sectional view of package 100 of FIG. 3 in accordance with an embodiment of the invention. A dielectric layer 60 may exist between die 10A and die 10B, between die 10B and die 10C, and between die 10C and die 10D. Dielectric layer 60 can electrically isolate the die from each other. Conductors 40 can extend vertically only as far as they need to in order to interface with interface bus connectors 20. For example, the conductors interfacing with interface bus connectors of die 10B extend from the top of die 10A to the bottom of die 10B. In other embodiments, conductors 40 can extend vertically along the entire height of package 100.

Figure 5:
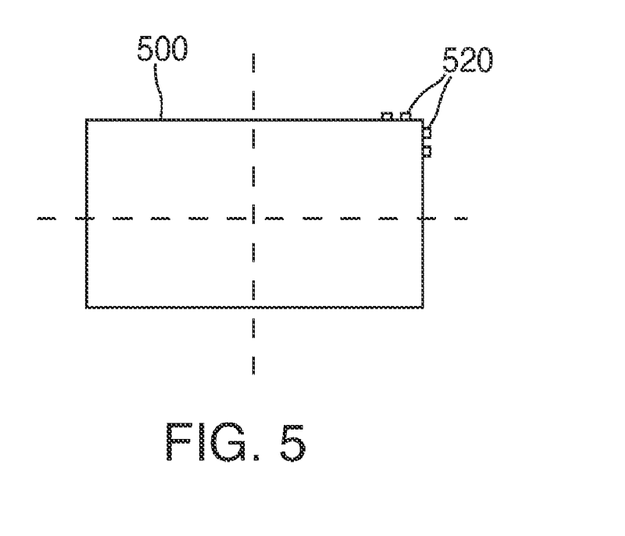
FIG. 5 shows an illustrative top view of die in accordance with an embodiment of the invention.
Figure 6:
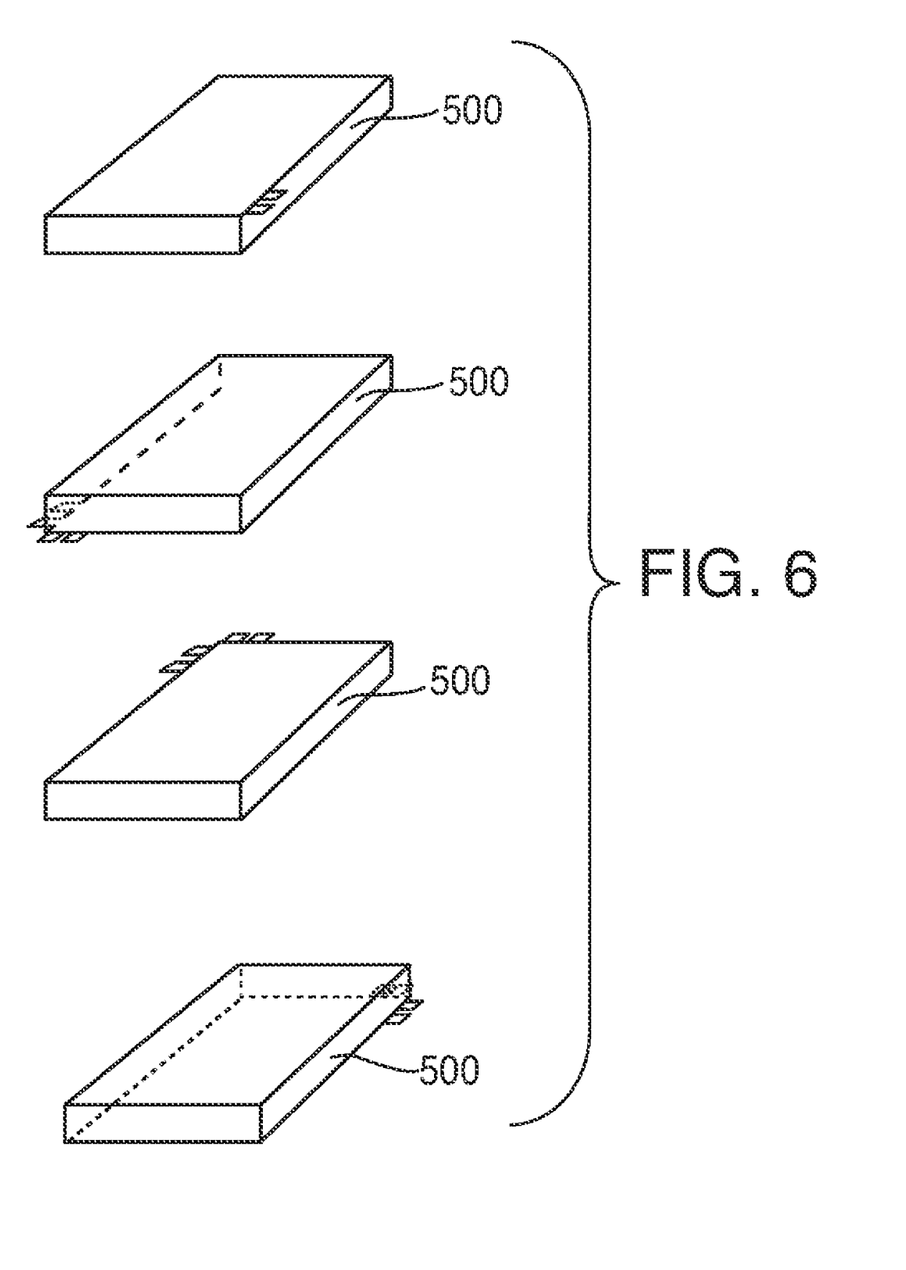
FIG. 6 illustrates how multiple copies of die of FIG. 5 can be arranged and stacked to provided a stacked NVM package according to an embodiment of the invention.

FIG. 5 shows an illustrative top view of die 500 having interface bus connectors 520 positioned in a quadrant in accordance with an embodiment of the invention. Although interface bus connectors 520 are in the same quadrant as the interface bus connectors 20 of FIG. 1A, the position of interface bus connectors 520 is different. As shown, interface bus connectors 520 extend away from two edges of die 500. FIG. 6 illustrates how multiple copies of die 500 can be arranged and stacked to provided a stacked NVM package according to an embodiment of the invention.

Figure 7:
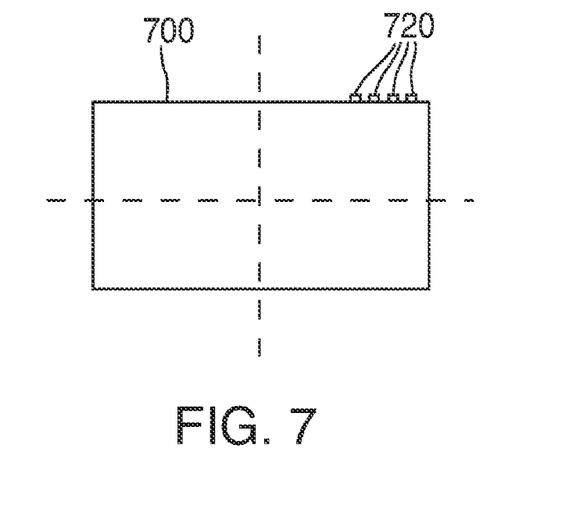
FIG. 7 shows an illustrative top view of die in accordance with an embodiment of the invention.
Figure 8:
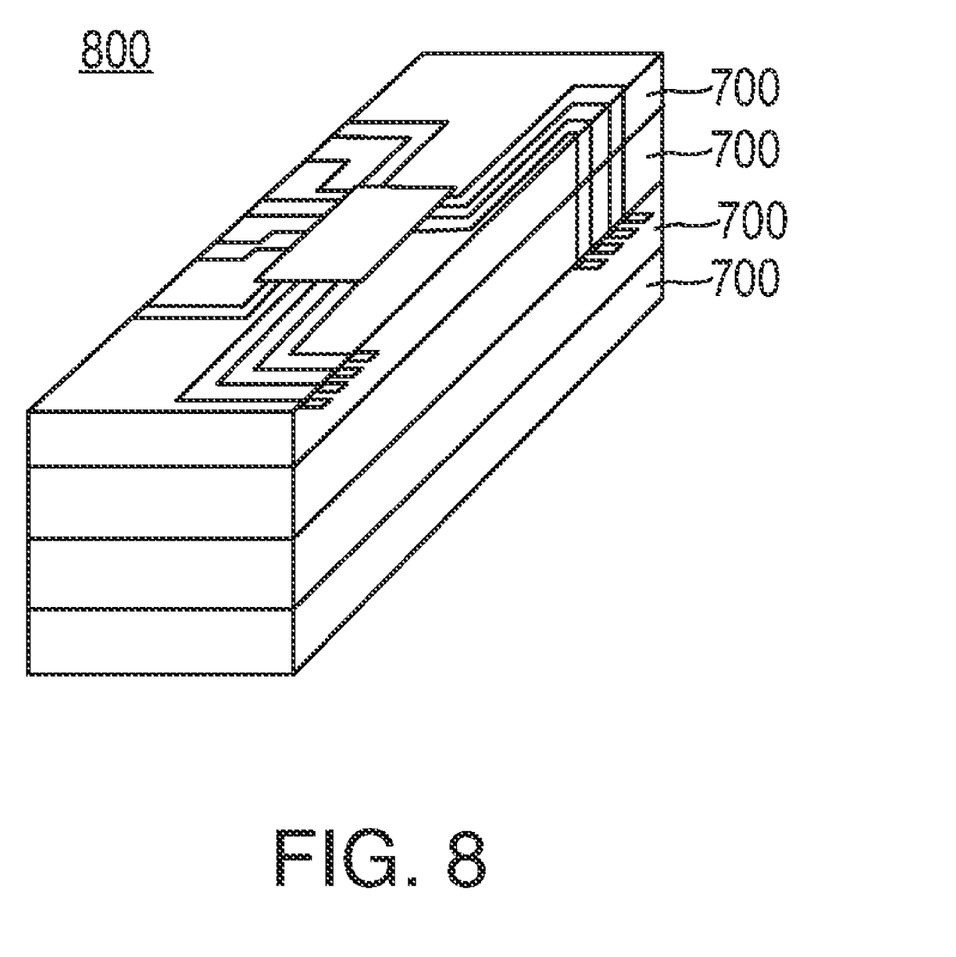
FIG. 8 shows an illustrative perspective view of a stacked NVM package constructed using several copies of the die of FIG. 7 in accordance with an embodiment of the invention.

FIG. 7 shows an illustrative top view of die 700 having interface bus connectors 720 positioned in a quadrant in accordance with an embodiment of the invention. The position of interface bus connectors 720 is in the same quadrant as the bus conductors of FIG. 1A, but are located on a different edge. FIG. 8 shows an illustrative perspective view of stacked NVM package 800 constructed using several copies of die 700 in accordance with an embodiment of the invention.

Figure 9:
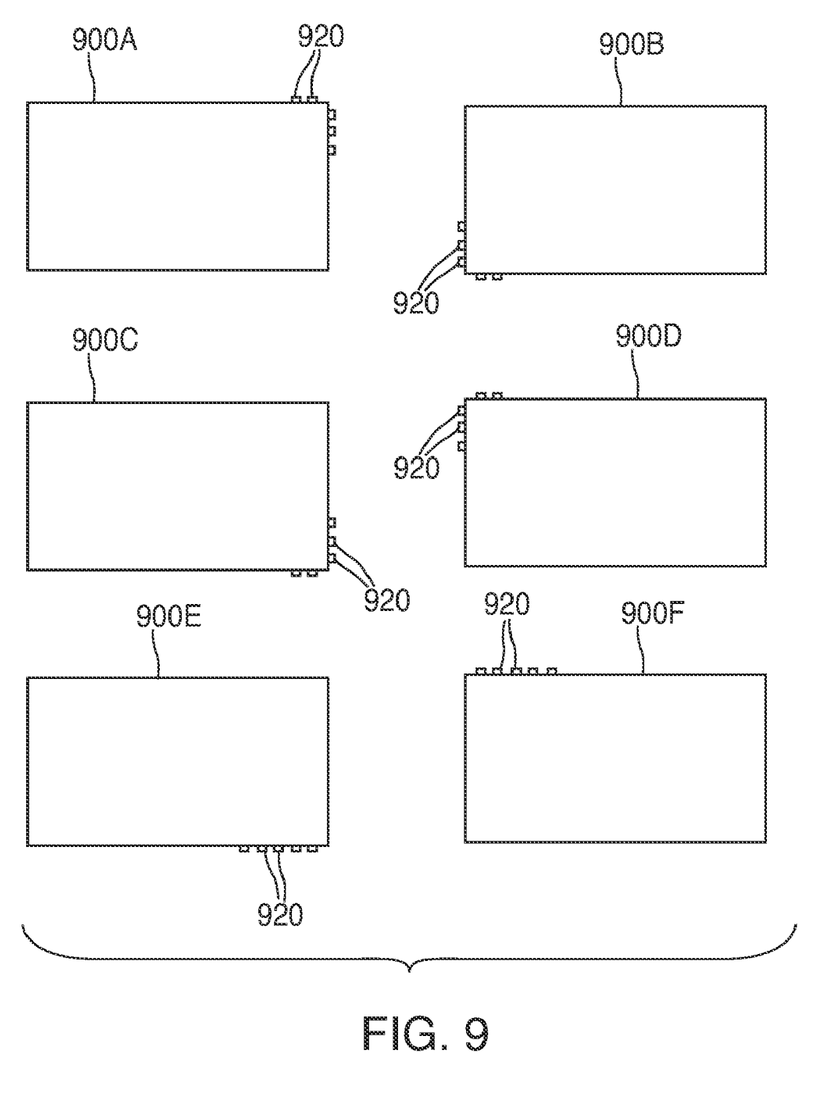
FIG. 9 shows illustrative top views of several different die that may be stacked to provide a stacked NVM package in accordance with an embodiment of the invention.

FIG. 9 shows illustrative top views of several different die that may be stacked to provide a stacked NVM package in accordance with an embodiment of the invention. Each die 900A-F is unique and has interface bus connectors 920 positioned in a specific location such that bus conductors 920 of one die do not overlap with bus conductors of another die when stacked together. Thus, when die 900A-F are stacked, interface bus connectors 920 for each die are in a different zone. An advantage of the unique die approach, at least compared to the multiple die copy approach of FIGS. 1-8, is that a greater number of die may be stacked together. Each die, however, may require custom pad and trace placement in order to accommodate various interface bus connector 920 positions.

Figure 10:
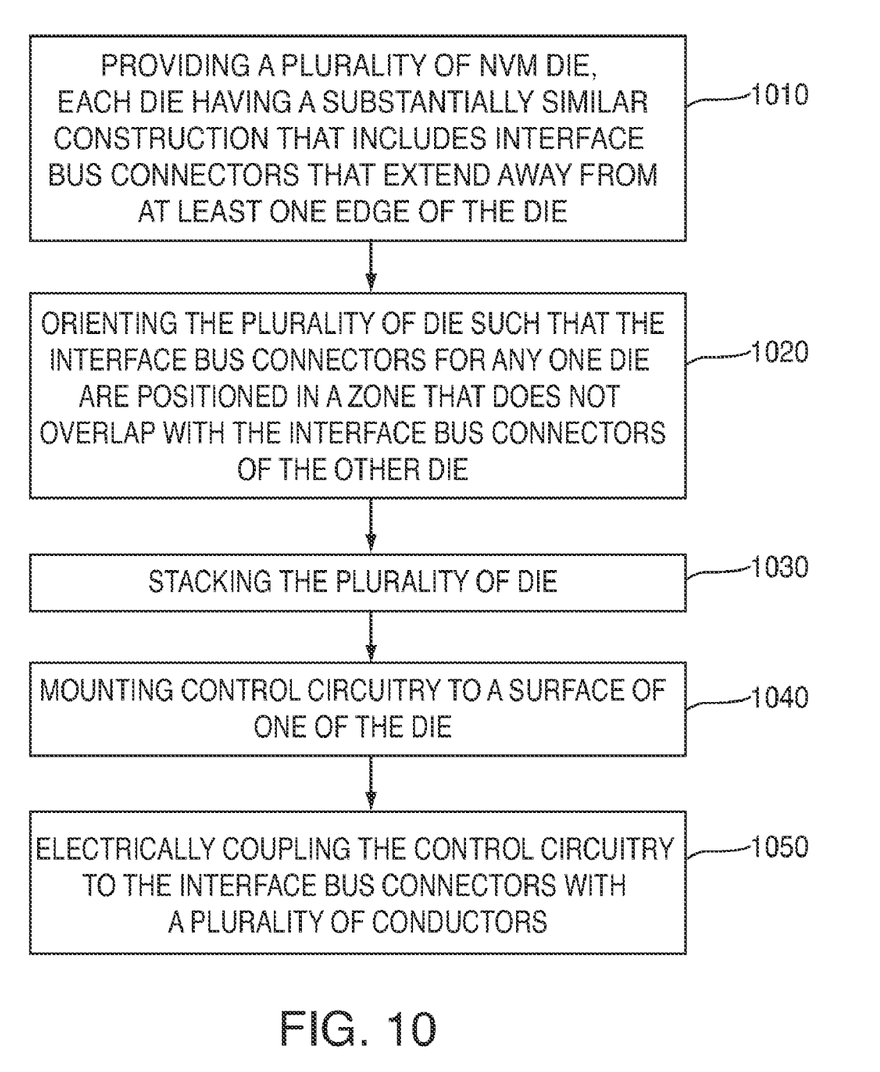
FIGS. 10 and 11 show illustrative flowcharts of steps that may be performed produce a stacked NVM package in accordance with embodiments of the invention.

FIG. 10 shows an illustrative flowchart of steps that may be performed to produce a stacked NVM package in accordance with an embodiment of the invention. Starting at step 1010, a plurality of NVM dies are provided, each die having a substantially similar construction that includes interface bus connectors that extend away from at least one edge of the die. For example, each die may be die 10 of FIG. 1A. At step 1020, the plurality of dies are oriented such that the interface bus connectors for any one die are positioned in a zone that does not overlap with the interface bus connectors of the other dies. This is illustrated in FIG. 2, for example. At step 1030, the oriented plurality of dies are stacked together. This is illustrated in FIG. 3, for example. At step 1040, control circuitry is mounted to a surface of one of the die. For example, the control circuitry can be mounted to the top die in the stack. At step 1050, conductors electrically couple the control circuitry to the interface bus connectors.

Figure 11:
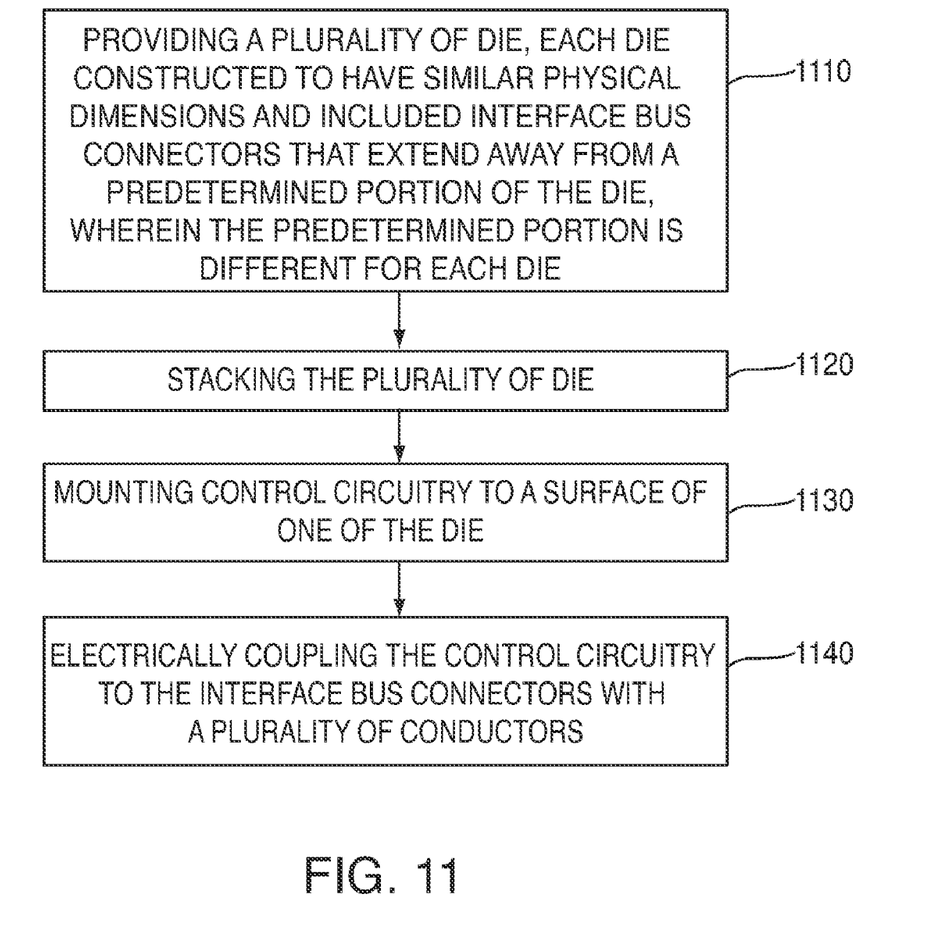

FIG. 11 shows an illustrative flowchart of steps that may be performed to produce a stacked NVM package in accordance with an embodiment of the invention. Starting at step 1110, a plurality of dies are provided, and each die is constructed to have similar physical dimensions and include interface bus connectors that extend away from a predetermined portion of the die. The predetermined portion is different for each die. An example of such dies is shown in FIG. 9. At step 1120, the plurality of dies are stacked. At step 1130, the control circuitry is mounted to surface of one of the die. At step 1140, conductors electrically couple the control circuitry to the interface bus connectors.

Figure 12:
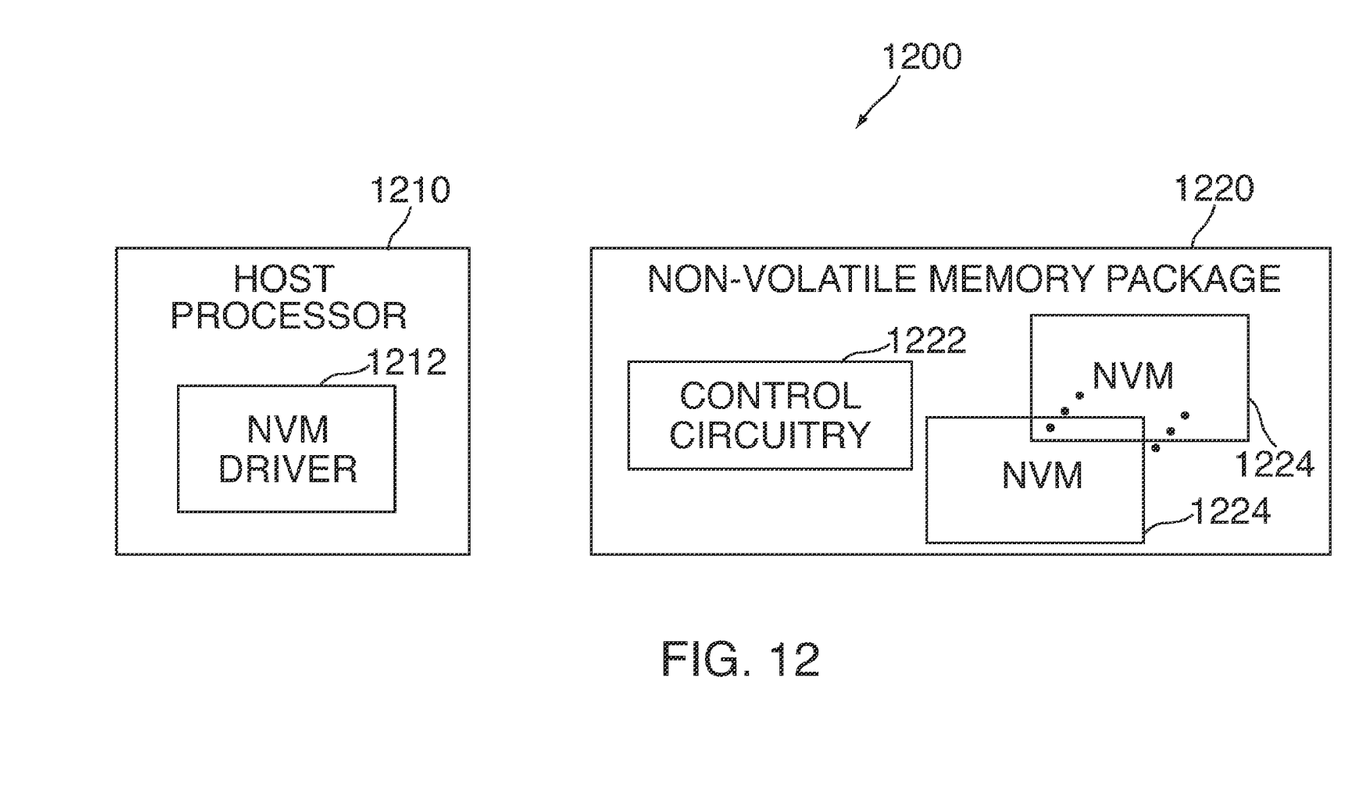
FIG. 12 is a simplified block diagram of a system using a stacked NVM die package in accordance with an embodiment of the invention.

FIG. 12 is a simplified block diagram of system 1200. System 1200 can include host processor 1210, and at least one non-volatile memory package 1220. Host processor 1210 and optionally NVM package 1220 can be implemented in any suitable host device or system, such as a portable media player, a cellular telephone, a pocket-sized personal computer, a personal digital assistance ("PDA"), a desktop computer, or a laptop computer. For simplicity, the host device or system, which may include host processor 1210, may sometimes be referred to simply as a "host".

Host processor 1210 can include one or more processors or microprocessors. Alternatively or in addition, host processor 1210 can include or operate in conjunction with any other components or circuitry capable of controlling various operations of system 1200 (e.g., application-specific integrated circuits ("ASICs")). In a processor-based implementation, host processor 1210 can execute firmware and software programs loaded into a memory (not shown) implemented on the host. The memory can include any suitable type of volatile memory (e.g., cache memory or random access memory ("RAM"), such as double data rate ("DDR") RAM or static RAM ("SRAM")). Host processor 1210 can execute NVM driver 1212, which may provide vendor-specific and/or technology-specific instructions that enable host processor 1210 to perform various memory management and access functions for non-volatile memory package 1220.

NVM package 1220 may be a stacked NVM package constructed in accordance with an embodiment of the invention. NVM package 1220 may be a comprehensive managed NVM package or simplified managed NVM package. In either managed NVM implementation, NVM package 1220 can include control circuitry 1222 (e.g., control circuitry 30 of FIG. 3), which is electrically coupled to any suitable number of stacked NVM dies 124. Control circuitry 1222 may include any suitable combination of processors or hardware-based components (e.g., ASICs), and may include the same components as or different components from host processor 1210. In the simplified managed NVM package, control circuitry 1222 may share the responsibility of managing and/or accessing the physical memory locations of NVM dies 1224 with NVM driver 1212. For example, NVM driver 1212 can perform all management functions except error correction, which is performed by control circuitry 1222.

In the comprehensive managed NVM package, control circuitry 1222 may perform substantially all of the management and access functions for NVM dies 1224 independent of host processor 1210. In this approach, control circuitry 1222 can pass data retrieved from NVM dies 1224 to host processor 1210. Comprehensive managed NVM packages can be found, for example, in USB thumb drives.

NVM dies 1224 may be used to store information that needs to be retained when system 1200 is powered down. As used herein, and depending on context, a "non-volatile memory" can refer to NVM dies in which data can be stored, or may refer to a NVM package that includes the NVM dies. NVM dies 1224 can be organized into "blocks," which are the smallest units of erase, and further organized into "pages," which are the smallest programmable and readable units. In some embodiments, the blocks from different dies may form "super blocks." Each memory location (e.g., page or block) of NVM dies 1224 can be addressed using a physical address (e.g., a physical page address or physical block address).

It should be understood that the processes described above are merely illustrative. Any of the steps may be removed, modified, or combined, and any additional steps may be added, without departing from the scope of the invention.

The described embodiments of the invention are presented for the purpose of illustration and not of limitation.

What is claimed is:

1. A non-volatile memory package, comprising:
   a plurality of dies each having a rectangular shape including a length, a width, a top surface, a bottom surface, and edges, the rectangular shape is divided into four quadrants, and each die is constructed to have bus interface connectors extending from a predetermined one of the quadrants such that each interface connector extends beyond at least one edge of the predetermined quadrant,
   wherein the plurality of dies are arranged in a vertical stack, the vertical stack having multiple non-overlapping zones, and each die is oriented such that the predetermined quadrant for each die is positioned in a different one of the non-overlapping zone;
   controller circuitry mounted on the top surface of a top die in the vertical stack; and
   a plurality of conductors that interface the controller circuitry to the bus interface connectors.

2. The non-volatile memory package of claim 1, wherein each conductor includes a vertical portion that is external to the edges of the die and interfaces with one of the bus interface connectors and a horizontal portion that interfaces with the control circuitry.

3. The non-volatile memory package of claim 1, wherein each conductor is electrically insulated.

4. The non-volatile memory package of claim 1, wherein the plurality of dies are nand flash die.

5. The non-volatile memory package of claim 1, wherein each of the plurality of dies are substantially the same.

6. The non-volatile memory package of claim 1, wherein the control circuitry comprises error correction circuitry.

7. A silicon package, comprising:
   a plurality of die arranged in a vertical stack, each die having bus interface connectors protruding away from the die;
   controller circuitry mounted to a surface of one of the die; and
   conductors that electrically couple the controller circuitry to the interface bus connectors, wherein the conductors are mounted external to the plurality of die.

8. The silicon package of claim 7, wherein each die in the plurality of die is constructed to have its interface bus connectors located in the same location, and wherein each die is arranged in the vertical stack so that the conductors do not overlap each other.

9. The silicon package of claim 7, wherein each die in the plurality of die is constructed to have its interface bus connector located in a location different than the location of each other die.

10. The silicon package of claim 7, wherein the conductors do not overlap each other and are electrically isolated from each other.

11. The silicon package of claim 7, wherein a portion of at least one conductor is aligned perpendicular to a plane of a top surface of the vertical stack.

12. The silicon package of claim 7, further comprising:
an insulation material disposed between each die in the stack.

13. A method for making a stacked non-volatile die package, the method comprising:
providing a plurality of NVM dies, each die having a substantially similar construction that includes interface bus connectors that extend away from at least one edge of the die;
orienting the plurality of dies such that the interface bus connectors for any one die are positioned in a zone that does not overlap with the interface bus connectors of the other dies;
stacking the oriented plurality of dies;
mounting control circuitry to a surface of one of the die; and
electrically coupling the control circuitry to the interface bus connectors with a plurality of conductors.

14. The method of claim 13, further comprising:
placing a dielectric material between each of the plurality of dies to electrically isolate each die from each other.

15. A method for making a stacked die package, the method comprising:
providing a plurality of dies, each die constructed to have similar physical dimensions and include interface bus connectors that extend away from a predetermined portion of the die, wherein the predetermined portion is different for each die;
stacking the plurality of dies;
mounting control circuitry to a surface of one of the die; and
electrically coupling the control circuitry to the interface bus connectors with a plurality of conductors.

* * * * *